United States Patent
Karanikos

(10) Patent No.: US 9,901,147 B1
(45) Date of Patent: Feb. 27, 2018

(54) CASE FOR WEARABLE ELECTRONIC DEVICE

(71) Applicant: Apple Inc., Cupertino, CA (US)

(72) Inventor: Demetrios B. Karanikos, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/616,631

(22) Filed: Jun. 7, 2017

(51) Int. Cl.
*A45C 15/00* (2006.01)
*A44C 5/00* (2006.01)
*H05K 5/02* (2006.01)
*B65D 25/10* (2006.01)
*A44C 5/14* (2006.01)
*F16B 1/00* (2006.01)
*H02J 7/02* (2016.01)

(52) U.S. Cl.
CPC .............. *A44C 5/0015* (2013.01); *A44C 5/14* (2013.01); *B65D 25/10* (2013.01); *F16B 1/00* (2013.01); *H05K 5/0204* (2013.01); *H05K 5/0226* (2013.01); *F16B 2001/0035* (2013.01); *H02J 7/025* (2013.01)

(58) Field of Classification Search
CPC ................ A44C 5/14; A45C 2011/002; A45C 2011/003; A45C 2013/025; A45F 5/00; B65D 25/10; G06F 1/1628
USPC ......... 206/38, 301, 320, 477, 480, 560, 564, 206/565, 818
See application file for complete search history.

(56) References Cited

U.S. PATENT DOCUMENTS

| | | | | |
|---|---|---|---|---|
| 1,615,324 A | * | 1/1927 | Bulova | A47F 7/03 206/301 |
| 3,365,056 A | * | 1/1968 | Mandel | B65D 75/32 206/301 |
| 3,918,577 A | * | 11/1975 | Horzick | B65D 85/40 206/216 |
| 4,094,409 A | * | 6/1978 | Spranger | A47F 7/022 206/301 |
| 4,650,077 A | * | 3/1987 | Droz | A47F 7/022 206/480 |
| 5,901,846 A | * | 5/1999 | Betcher | B25H 3/02 206/349 |
| 5,927,507 A | * | 7/1999 | Shelton | B65D 25/101 206/301 |

(Continued)

*Primary Examiner* — Luan K Bui
(74) *Attorney, Agent, or Firm* — Kilpatrick Townsend & Stockton LLP

(57) ABSTRACT

A case for a wrist-worn electronic device and one or more bands that can be attached to a wrist-worn electronic device. The case can include first and second housing members foldably coupled together by one or more hinges between an open position and a closed position; a recess formed in one of the housing members that is sized and shaped to hold the one or more bands within the case; and an attachment mechanism positioned within the cavity. The attachment mechanism can include a piston having a cam profile at a first end and slidably coupled to one of the housing members between a first piston position and a second piston position, and a first magnet mechanically coupled to the piston near a second end, opposite the first end. The case can further include a second magnet positioned within the second housing member and spaced apart from the first magnet, wherein the first and second magnets are aligned to repel each other biasing the piston in the first piston position.

20 Claims, 5 Drawing Sheets

(56) References Cited

U.S. PATENT DOCUMENTS

| | | | |
|---|---|---|---|
| 7,793,782 B2* | 9/2010 | Chuang | A45C 13/02 190/33 |
| 2005/0103673 A1* | 5/2005 | Eichenberger | B65D 81/07 206/477 |
| 2015/0137731 A1 | 5/2015 | Kim | |
| 2015/0200554 A1 | 7/2015 | Marks et al. | |
| 2016/0357324 A1 | 12/2016 | Smith et al. | |

\* cited by examiner

CASE FOR WEARABLE ELECTRONIC DEVICE

FIELD

The present disclosure relates generally to wirelessly charging electronic devices, to cases and/or docking stations for electronic devices, and to systems and methods associated with such.

BACKGROUND

Many portable electronic devices include one or more rechargeable batteries that require external power to recharge from time to time. These devices may include cell phones, smart telephones, wearable devices, navigation devices, sports devices, health devices, accessory devices, and so on.

Some portable electronic devices with rechargeable batteries, including some wearable electronic devices include an inductive charging system or other type of wireless charging system. In an inductive charging system, a user may place the electronic device on an inductive charging surface to replenish the internal battery without the need for plugging the device into a charging cable.

One type of wearable electronic device that is becoming more common is a device that can be worn on a user's wrist and do much more than act as a simple time piece. Such devices may include a display to indicate the time and date. The devices may also include accelerometers and one or more sensors that enable a user to track fitness activities and health-related characteristics, such as heart rate, blood pressure, and body temperature, among other information. The devices also typically include a rechargeable battery that powers the electronics within the device.

In some instances, such wrist-worn electronic devices can be part of a large ecosystem of interchangeable bands and devices such that a user may have two or more bands the user may want to use with their wearable electronic device.

SUMMARY

Some embodiments of the disclosure pertain to a case that can securely hold and store a portable electronic device, such as a wrist-worn or other wearable electronic device, along with one or more bands that can be used with the device. Embodiments of the case can include circuitry that can charge the stored electronic device and some embodiments can further include circuitry that can charge the one or more bands stored in the case if those bands have electronic components, such as circuitry, sensors and/or batteries, that also require power.

In some embodiments, the case can include an attachment system that allows bands of different geometry, including bands that vary in length, width and/or thickness from each other, to be secured within the case. For example, the bands in one ecosystem of wearable devices all include a lug at each end of the band that is configured to attach the band to the face of the wearable electronic device. While the size and shape of the lugs may vary in certain ways, embodiments of the disclosure enable a band to be secured in the case by pushing the lug into the attachment system with minimal force. The attachment system can include a pair of magnets spaced apart from each other with a first magnet in a moveable piston and the second magnet positioned within the housing of the casing. The piston can have a cam profile at one end that includes a first angled surface that the lug comes into contact with during the insertion process forcing the piston towards the second magnet against the repulsive force. When the lug is pushed an apex of the cam profile, the lug can snap into a secured position in which the lug is positioned under a second angled surface of the cam profile. The attachment system further allows a user to extract the band from the case with minimum force by tilting the band (e.g., lifting the band up) towards the second surface, which again forces the piston towards the second magnet against the repulsive force and allows the lug to be pulled up past the apex of the cam profile and the band to be extracted from the case.

Some embodiments of the disclosure pertain to a case that can hold one or more bands that can be attached to a wrist-worn electronic device. The case can include first and second housing members foldably coupled together by one or more hinges between a first open position and a second folded and closed position; a cavity sized and shaped to hold the one or more bands within the case when the first and second housing members are in the second position; and an attachment mechanism coupled to the second housing member and positioned within the cavity. The attachment mechanism can include a piston having a cam profile at a first end and slidably coupled to the second housing member between a first piston position and a second piston position, and a first magnet mechanically coupled to the piston near a second end, opposite the first end. The case can further include a second magnet positioned within the second housing member and spaced apart from the first magnet, where the first and second magnets are aligned to repel each other biasing the piston in the first piston position.

In various examples, the case can include one or more of the following features. The cavity can include a lug receiving portion, a band receiving portion and a neck portion between the lug receiving portion and the band receiving portion where the lug receiving portion has a first width and the neck portion has a second width narrower than the first width. The first and second magnets can be positioned to bias the piston towards the neck portion. And, the attachment mechanism can be configured to secure the lug in the lug receiving portion such that the cam profile of the piston overhangs the lug.

In some embodiments a case for storing a wrist-worn electronic device and a band that can be attached to the wrist-worn electronic device by a lug coupled to the band is provided. The case can include: first and second housing members foldably coupled together by one or more hinges between a first open position in which the wrist-worn electronic device and band are accessible to a user and a second closed position in which the wrist-worn electronic device and band are enclosed within the case; a first recess in one or both of the first and second housing members sized and shaped to hold the wrist-worn electronic device within the case when the first and second housing members are in the second position; a second recess in the second housing member; and an attachment mechanism coupled to the second housing member and positioned within the second recess. The attachment mechanism can include a piston having a cam profile at a first end and slidably coupled within the second recess between a first piston position and a second piston position, and a first magnet mechanically coupled to the piston near a second end, opposite the first end. The case can further include a second magnet positioned within the second housing member and spaced apart from the first magnet, wherein the first and second magnets are aligned to repel each other biasing the piston in the first piston position.

In still other embodiments a case for storing a wrist-worn electronic device separate from a band that can be attached to the wrist-worn electronic device by a lug coupled to the band is provided. The case can include a first housing member; a second housing member having a first recess sized and shaped to accept the wrist-worn electronic device and a second recess sized and shaped to accept the band; one or more hinges that couple the first housing member to the second housing member such that the first and second housing members are foldable between a first open position in which the wrist-worn electronic device and band are accessible and a second closed position in which the wrist-worn electronic device and band are secured within the case; and an attachment mechanism coupled to the second housing member and positioned within the second recess. The attachment mechanism can include a piston having a cam profile at a first end and slidably coupled to the second housing member between a first piston position and a second piston position, and a first magnet mechanically coupled to the piston near a second end, opposite the first end. And the case can further include a second magnet positioned within the second housing member and spaced apart from the first magnet, where the first and second magnets are aligned to repel each other biasing the piston in the first piston position.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Figure 1A:
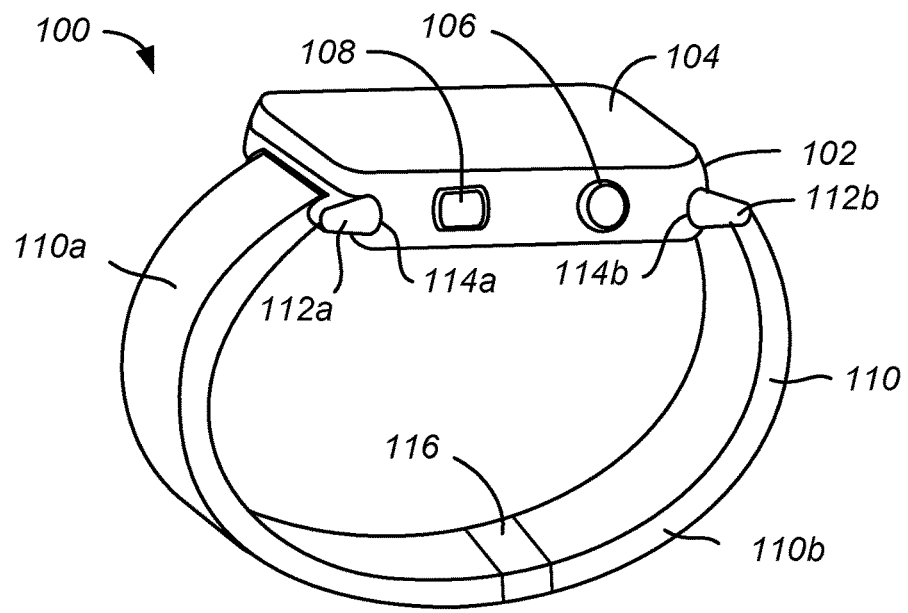
FIG. 1A illustrates a side perspective view of one type of wearable electronic device with which embodiments of the disclosure may be used.
Figure 1B:
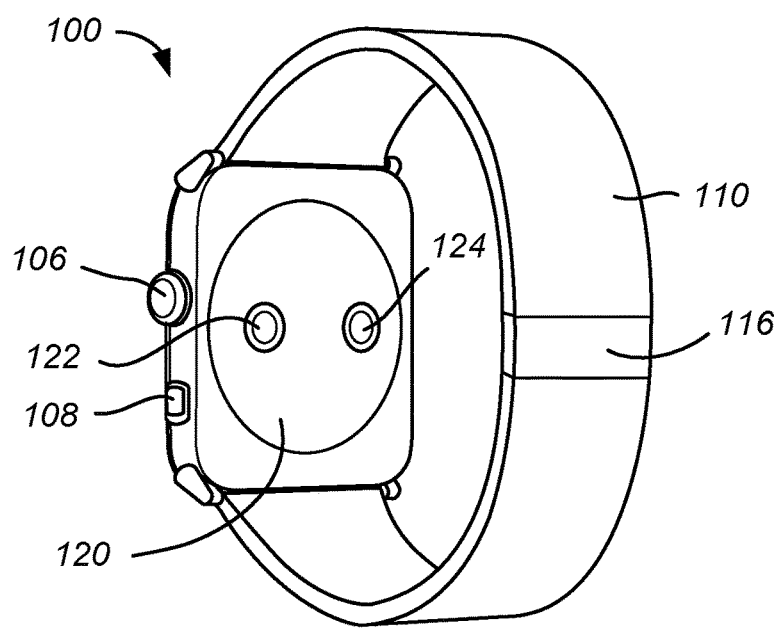
FIG. 1B illustrates a rear perspective view of the wearable electronic device shown in FIG. 1A.

Reference is now made to FIGS. 1A and 1B, which depict side and rear perspective views of one type of wearable electronic device with which embodiments of the disclosure may be used. As shown, wearable electronic device 100 includes a casing 102 that houses a display 104 and various input devices including a dial 106 and a button 108.

Device 100 may be worn on a user's wrist and secured thereto by a band 110. Thus, in some instances, wearable electronic device 100 can be referred to as a wrist-worn electronic device. Band 110 includes lugs 112a, 112b at opposing ends of the band that fit within respective recesses or apertures 114a, 114b of the casing and allow band 110 to be removeably attached to casing 102. Lugs 112a, 112b may be part of band 110 or may be separable (and/or separate) from the band. Generally, each lug may lock into one of recesses 114a, 114b and thereby maintain connection between the band and casing 102. The user may release a locking mechanism (not shown) to permit the lugs to slide or otherwise move out of the recesses. In some wearable devices, the recesses may be formed in the band and the lugs may be affixed or incorporated into the casing.

Casing 102 also houses electronic circuitry (not shown in FIG. 1A or 1B), including a processor and communication circuitry, along with sensors 122, 124 that are exposed on a bottom surface 120 of casing 102. The circuitry, sensors, display and input devices enable wearable electronic device 100 to perform a variety of functions including, but not limited to: keeping time; monitoring a user's physiological signals and providing health-related information based on those signals; communicating (in a wired or wireless fashion) with other electronic devices; providing alerts to a user, which may include audio, haptic, visual and/or other sensory output, any or all of which may be synchronized with one another; visually depicting data on a display; gathering data form one or more sensors that may be used to initiate, control, or modify operations of the device; determining a location of a touch on a surface of the device and/or an amount of force exerted on the device, and use either or both as input; accepting voice input to control one or more functions; accepting tactile input to control one or more functions; and so on.

A battery (not shown in FIG. 1A or 1B) internal to casing 102 powers wearable electronic device 100. The battery can be inductively charged by an external power source, such as a wireless charger, and wearable electronic device 100 can include circuitry configured to operate as a receiver in a wireless power transfer system as described with respect to FIG. 9. Bottom surface 120 can have a convex shape that enables the surface to facilitate proper alignment to a wireless power transmitter in the wireless charger. Also, while not shown in FIG. 1A or 1B, wearable electronic device 100 may include one or more magnets or magnetic plates, such as alignment magnet 918 shown in FIG. 9, that can further assist in aligning wearable electronic device 100 to the charging surface of a wireless charger.

Figure 2:
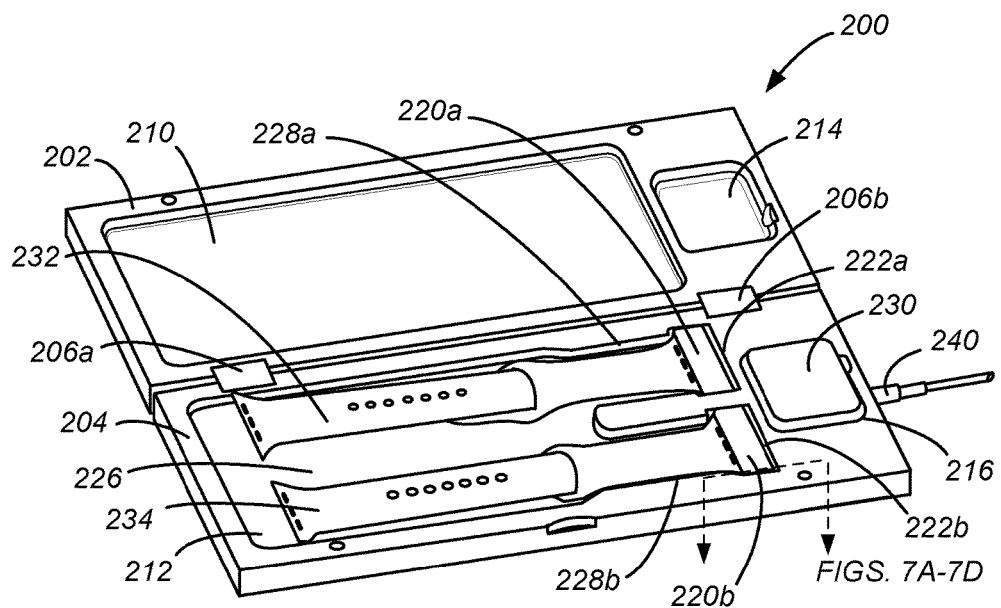
FIG. 2 is a simplified perspective view of a case for a wearable electronic device in an open position according to some embodiments of the disclosure.

Reference is now made to FIG. 2, which is a simplified perspective view of a case 200 according to some embodiments of the disclosure. Case 200 can be used, for example, as a travel case to store a wearable electronic device and one or more bands that can be used to secure the wearable electronic device to a user's wrist. As shown in FIG. 2, case 200 is designed to hold a single wrist-worn electronic device 230 along with first and second bands 232 and 234 either one of which can be used to attach wrist-worn electronic device to a user's wrist. Each of bands 232 and 234 includes first and second band segments (e.g., segments 234a, 234b of band 234) that can be connected together by a clasp or other type of connector (e.g., clasp 116 shown in FIGS. 1A, 1B), and each band segment includes a lug (not labeled) at one end. Embodiments of the disclosure can store bands having multiple segments, such as bands 232, 234, as well as bands having a single segment.

Additionally, embodiments of the disclosure are not limited to storing any particular number of devices or bands. For example, some embodiments can be designed to store a wrist-worn electronic device and just a single band, while other embodiments can be designed to store a wrist-worn electronic device and more than two bands. Still other embodiments can be designed to store only one or more bands and thus do not include a cavity, recess or any similar area for storing a corresponding wrist-worn electronic device.

Figure 3:
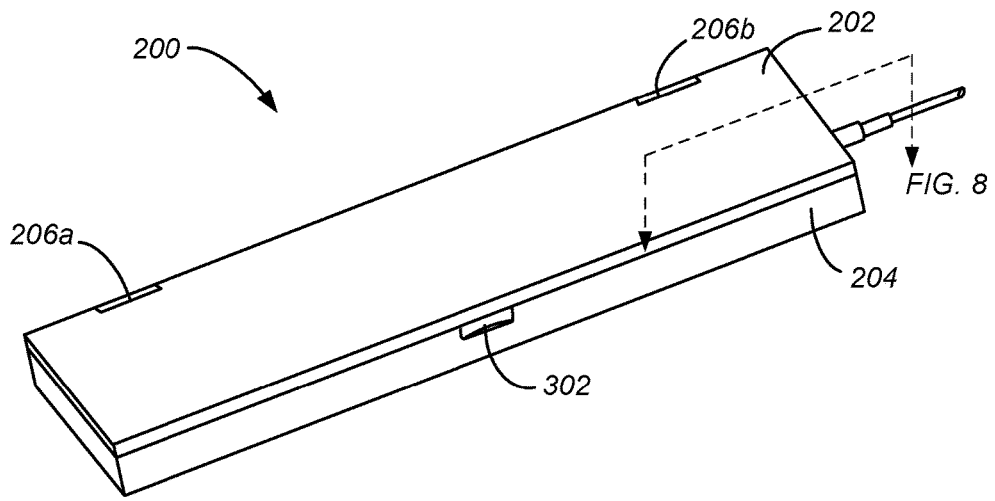
FIG. 3 is a simplified top perspective view of the case for a wearable electronic device shown in FIG. 2 in a folded position.

Case 200 includes first and second housing members 202 and 204 and is shown in FIG. 2 in an open position in which the inner surfaces of each housing member 202, 204 are both facing upward in the same direction. Case 200 can be folded together at hinges 206a and 206b so that the inner surfaces of each housing member 202, 204 face each other thereby reducing the width of the case in half as shown in FIG. 3. First housing member 202 includes a recess or cavity 210 and second housing member 204 includes a complementary recess or cavity 212. Cavities 210 and 212 are sized and shaped such that, when casing 200 is in the folded position, two bands 232 and 234 fit within the combined cavity and are protected within the case. Similarly, first housing member 202 also includes a recess or cavity 214 and second housing member 204 includes a complementary recess or cavity 216, such that when case 200 is in the folded position, cavities 214 and 216 combine to secure wrist-worn electronic 230 within the case within the combined cavity.

Case 200 further includes a receptacle connector and circuitry that accepts power from an external source and can charge wrist-worn device 230. Neither the receptacle or charging circuitry are shown in FIG. 2, but the receptacle connector is shown as connector 224 in FIG. 6 and the charging circuitry is shown as circuitry 810 in FIG. 8. A plug connector 240 can be mated with the receptacle connector to provide power to the charging circuitry. In some embodiments, plug connector can also be used to transfer data to/from case 200. Also included within case 200 are two band attachment mechanisms 220a, 220b, one for each of bands 232 and 234, that sit within portions 222a, 222b of cavity 212. Each of portions 222a, 222b is sized and shaped to include its respective attachment mechanism and enable a lug for a watch band to be inserted into portion 222a, 222b and secured by the attachment mechanism. A larger portion 226 of cavity 212 is sized and shaped to receive the watch bands and is connected to portions 222a, 222b by neck regions 228a, 228b that are narrower in width than portions 222a, 222b. In some embodiments the narrower necks are sized and shaped to accommodate the width of a band but are narrower than the width of the lugs. In other embodiments, instead of having a common area 226, cavity 212 can be separate cavities, one for each band that case 200 is designed to accommodate. Further details of attachment mechanisms 220a, 220b are described in more detail below in conjunction with FIGS. 7A-7D.

Figure 4:
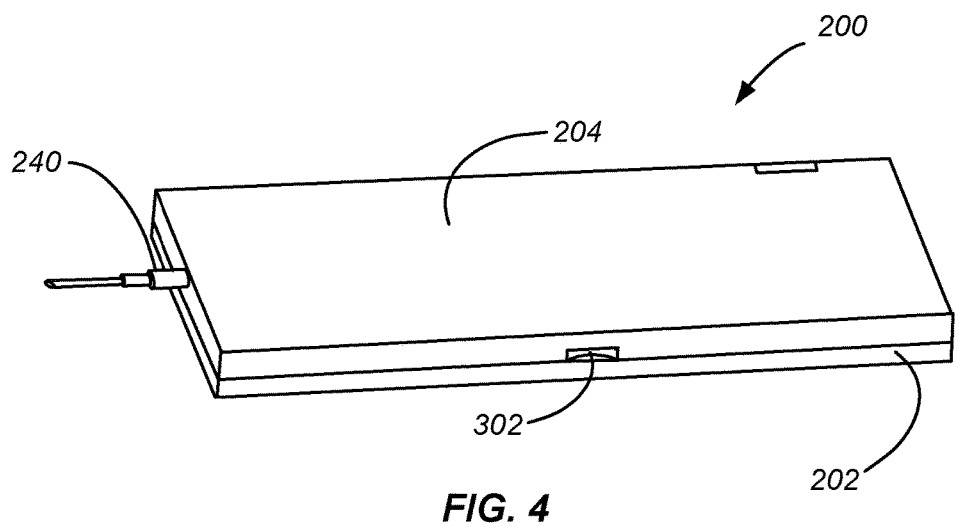
FIG. 4 is a simplified bottom perspective view of the case for a wearable electronic device shown in FIG. 2 in a folded position.
Figure 5:
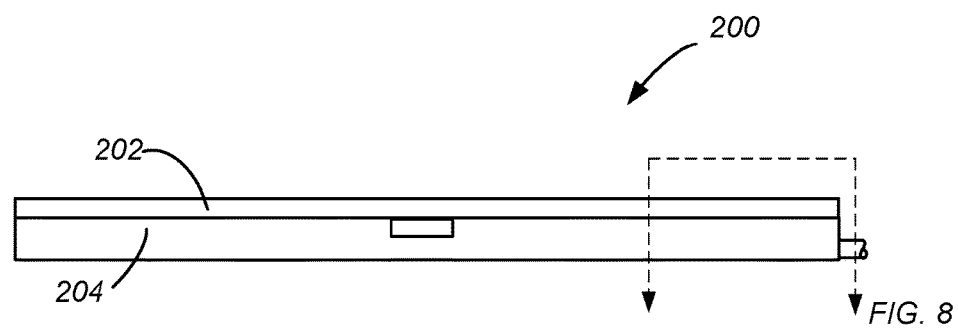
FIG. 5 is a simplified side plan view of the case for a wearable electronic device shown in FIG. 2 in a folded position.
Figure 6A:
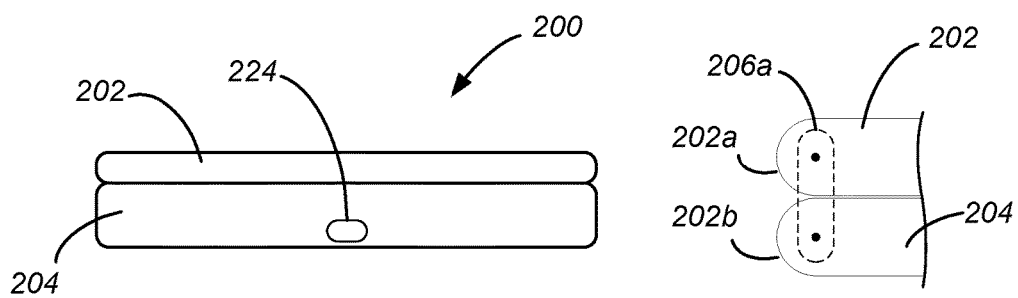
FIG. 6A is a is a simplified rear plan view of the case for a wearable electronic device shown in FIG. 2 in a folded position.

FIGS. 3-6 illustrate additional views of case 200. Specifically, FIG. 3 is a simplified top perspective view of case 200 in the folded position; FIG. 4 illustrates a simplified bottom perspective view of case 200 in the folded position and FIGS. 5 and 6 illustrate simplified side and front plan views, respectively, of case 200 in the folded position. As shown in each of these figures, first and second housing members 202 and 204 have essentially the same length and width so that when the housing members are in the folded position the case has a solid and secure feel. One or more magnets, not shown, can be included in case 200 to keep the case in the folded position until a force is applied by a user to open the case. Towards this end, case 200 can include a slight recess or curved notch area 302 that can be centered along the length of housing member 204 to enable a user to insert his or her thumb, finger or the like and more easily open the case.

Figure 6B:
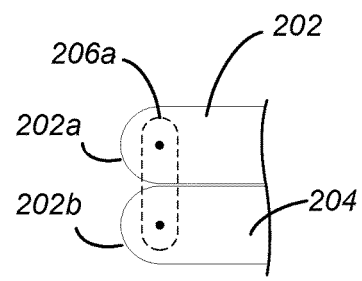
FIG. 6B illustrates a hinge that can be employed in the case for a wearable electronic device shown in FIG. 2 according to some embodiments of the disclosure.

Hinges 206a, 206b allow housing members 202 and 204 to open completely flat and completely close. In some embodiments, the hinges also allow housing member 202 to fold over onto the back of housing member 204 such that the housing members are in a folded position but with the cavities 210 and 212 each on outer surfaces of the folded device instead of facing each other. To enable such a full rotational motion, in some embodiments housing members 202 and 204 can have full rounds along edges 202a, 204a that hinges 206a, 206b are connected to as shown in FIG. 6B. The full rounds enable rotational movement of the members all the way around thus allowing the members 202, 204 to fold flat in the two different configurations described without any interference between the members during the entire rotational motion of the hinges.

Hinges 206a, 206b can also include detents that enable the hinges to mechanically stay in multiple different positions depending on the number of detents. The detents can receive dimples or other retention features that enable housing members 202, 204 to be positioned in multiple different positions.

While the embodiments described immediately above include two separate hinges 206a, 206b, embodiments of the invention are not limited to any particular number of hinges. In some embodiments a single hinge can be employed and other embodiments more than two hinges can be employed.

Figure 7A:
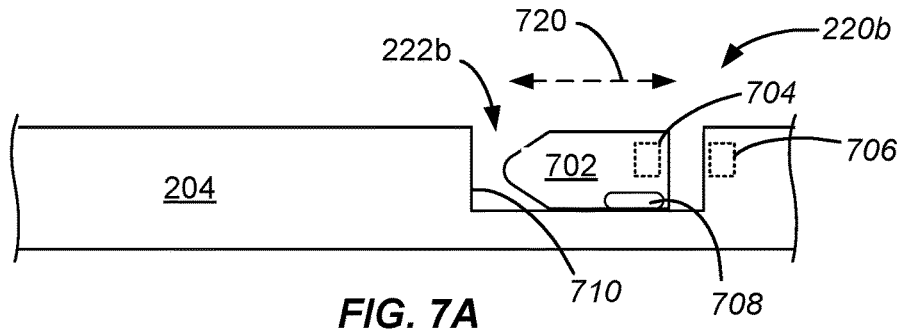
FIGS. 7A-7D illustrate simplified cross-sectional views of a portion of the case for a wearable electronic device shown in FIG. 2 as a band is inserted into and extracted from the case.

Reference is now made to FIGS. 7A-7D, which illustrate cross-sectional views of a portion of case 200 as a band 750 is inserted into and extracted from the case with respect to attachment mechanism 220b. While not shown in FIGS. 7A-7D, attachment mechanism 220a can be similar to or identical to attachment mechanism 220b. FIG. 7A is a cross-sectional view through the portion of case 200 indicated by the dotted line in FIG. 2 prior to the insertion of a band into cavity 212. As shown in FIG. 7A, attachment mechanism 220b includes a piston 702. Piston 702 is slidably coupled to housing 204 by a tooth 708 that includes opposing ends that fit within an undercut portion (not shown) of cavity 222b such that the piston can move back and forth within portion 222b of cavity 212 in the direction indicated by arrow 720. In other embodiments, other types of mechanisms, such as a knob attached to piston 702 that slides within a groove formed at the bottom of cavity 222b, can be used to allow piston 702 to move back and forth within cavity 212.

A first magnet 704 is positioned within piston 702 and a second magnet 706 is positioned within housing 204. Magnets 704 and 706 are aligned so that the repel each other forcing piston 702 towards wall 710 of cavity 222b. Additionally, piston 702 has a cam profile at one end facing wall 710, which can be a part of housing member 204 that forms the neck region 228b of cavity 212. The cam profile forms an undercut that can secure a band to case 200 via a lug as described below.

Figure 7B:
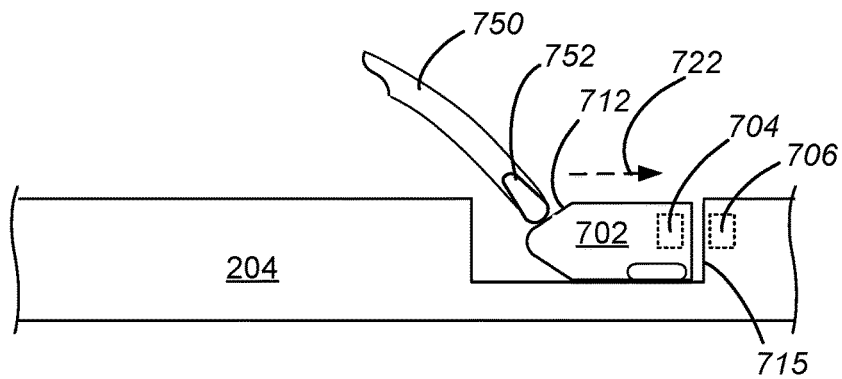
Figure 7C:
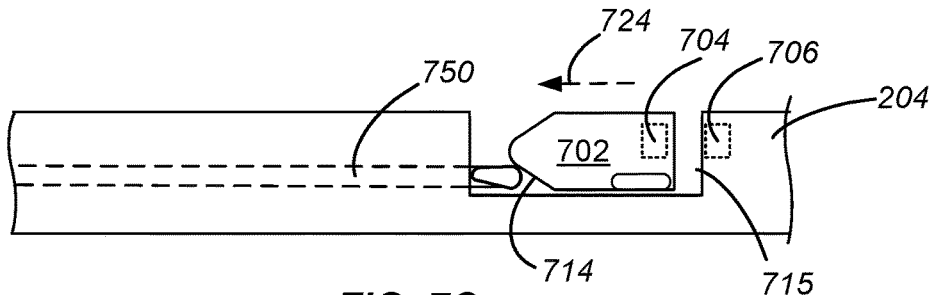

FIG. 7B illustrates a band 750 that is about to be inserted into cavity 222b. Band 750 includes a lug 752 that can be pressed against an angled surface 712 of piston 702. In response to the force against surface 712, piston 702 is pushed in direction 722 toward wall 715 of cavity 222b allowing lug 752 to be inserted into portion 222b and underneath an angled surface 714 of piston 702 as shown in FIG. 7C. In some embodiments, due to the cam profile of piston 702, the lug snaps into place into the secured position shown in FIG. 7B once the lug moves past the apex of the cam profile.

As shown in FIG. 7C, once lug 752 is positioned under surface 714 of piston 702, the magnets push the piston in direction 724 away from wall 715 and towards wall 710. The overlap of piston 702 secures the lug and band within case 202. Additionally, cavity 222b can be sized and shaped so that in the secured position shown in FIG. 7C, piston 702 can also push the outer portions of lug 752 against the wall 710 further securing the band within the cavity. In some embodiments, additional or different mechanisms can be included within case 202 to secure other portions of band 750 to the case. For example, in some embodiments an attachment mechanism similar to attachment mechanism 222b can also be included at the other end of case 200 to secure the other end band 750. Such an additional attachment mechanism can be adjustable within cavity 212 so that it can be properly positioned at different locations depending on the length of the particular band that the mechanism is intended to secure.

Figure 7D:
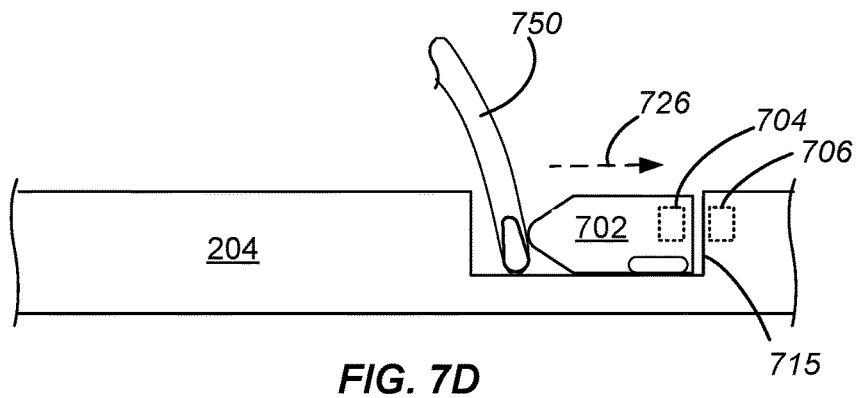

The process of removing a band from case 200 is illustrated in FIG. 7D, which is a simplified cross-sectional view of case 200 taken at the same location as FIGS. 7A-7C. To remove band 750 from the case, a user can lift up on the band producing extraction force against the undercut portion of piston 702 (surface 714) that moves the slidable piston 702 in direction 726 towards wall 715 so that band 750 can be readily removed.

The combination of magnets 704, 706 and piston 702 allows a user to insert and secure a band within case 202 with minimal force and conversely extract the band with minimum force. Additionally, bands in a given ecosystem can vary greatly in geometry including the width, length and thickness of the bands. The described attachment system secures the bands within case 202 by the lug portion of the band which enables bands of all different geometries to be held and secured within the case.

Figure 8:
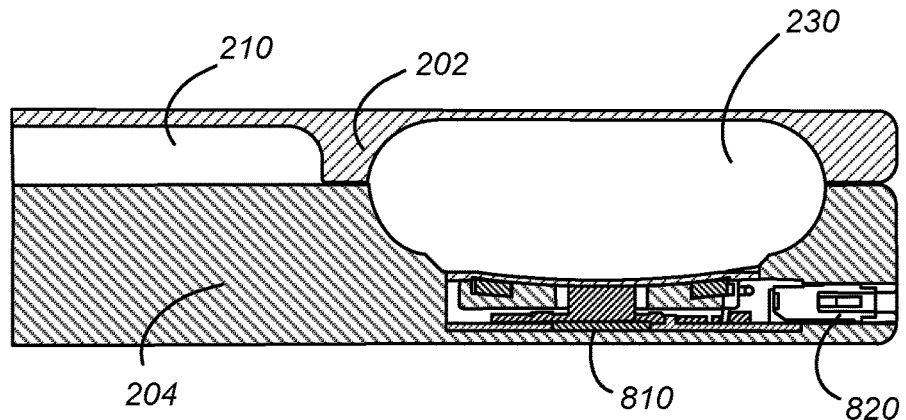
FIG. 8 depicts a simplified cross-sectional view of a portion of the case for a wearable electronic device shown in FIG. 2 taken along the dotted line shown in FIG. 3.

FIG. 8 shows a simplified cross-sectional view of a portion of case 200 taken along the dotted line shown in FIG. 3. As shown in FIG. 8, some embodiments of case 200 can include a wireless charger 810 that is configured to wireless charge wearable electronic device 230. Also shown in FIG. 8 is a receptacle connector 820 that can be mated with a corresponding plug connector so that power can be delivered to case 200 and/or data can be transferred between case 200 and another device over a wired interface. In some embodiments case 200 can include either or both an interface to wirelessly receive power and/or one or more interfaces to wireless exchange date with other devices. Also, while not shown in FIG. 8, in some embodiments case 200 can include one or more magnets positioned around the cavity that accepts wearable electronic device 230. The one or more magnets can be aligned with magnetic components of wearable electronic device 230 to magnetically secure the electronic device within the case.

Additionally, in some embodiments, case 200 can include circuitry that can charge one or more bands in addition to wearable electronic device 230. For example, either or both of bands 232 and 234 can be a "smart band". That is, a band that includes some form of circuitry that can supplements the capabilities of wearable electronic device 230, such as one or more sensors, a battery or other type of electronic device) that include a rechargeable battery within the smart band to power its circuitry. Some embodiments of case 200 can include charging circuitry that, once the smart band is secured within the case (e.g., in the manner described above with respect to FIGS. 7A-7D), the smart band will be in a position such that either electrical contacts of the band are coupled to contacts within case 200 to deliver power to the band or wireless power receiving circuitry of the band will be aligned with wireless power transmitting circuitry of the case to wirelessly deliver power to the band.

Figure 9:
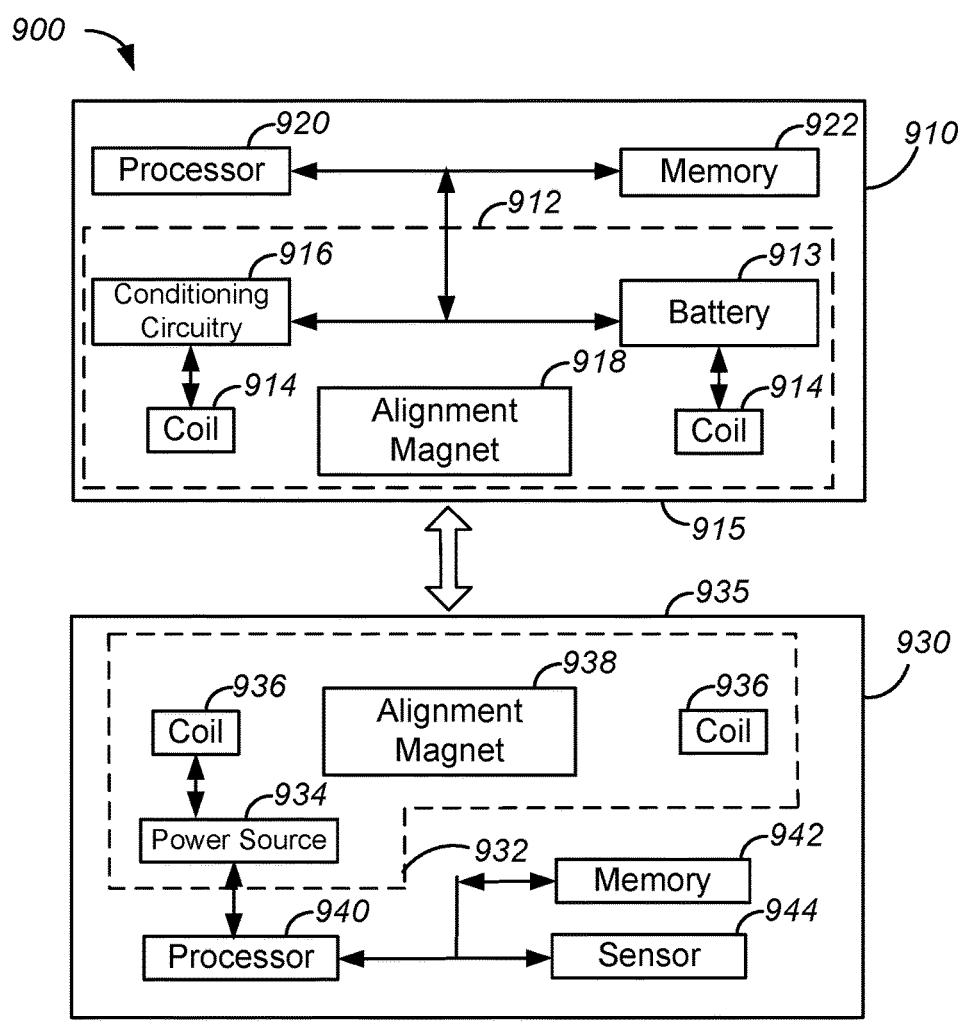
FIG. 9 is a simplified block diagram of various power-related components in a system that includes a wearable electronic device and a wireless charger according to some embodiments of the disclosure.

FIG. 9 is a simplified block diagram of various power-related components in a system 900 that includes a portable electronic device 910 and a wireless charger 930. System 900 can be representative of components in wearable electronic device 230 and wireless charging circuitry 810 within case 200. That is, portable electronic device 910 can be, for example, wearable device 230 discussed above. Wireless charger 930 can be, for example, wireless charger 810 referenced above.

As shown in FIG. 9, portable electronic device 910 includes an inductive power-receiving component 912 while wireless charger 930 includes a power-transmitting component 932. In system 900, power receiving component 912 can be operatively coupled to power transmitting component 932 to charge a battery 913 within the portable electronic device. Within the power receiving component, battery 913 is operably connected to a receive coil 914 via power conditioning circuitry 916. Receive coil 914 can be inductively coupled to a transmit coil 936 of wireless charger 930 to receive power wirelessly from the charger and pass the received power to battery 913 within the portable electronic device via power conditioning circuitry 916.

Power conditioning circuitry 916 can be configured to convert alternating current received by the receive coil 914 into direct current power for use by other components of portable electronic device 910. Also within device 910, a processing unit 920 may direct the power, via one or more routing circuits and under the execution of an appropriate program residing in a memory 922, to perform or coordinate one or more functions of the portable electronic device typically powered by battery 913.

Within wireless charger 930, power transmitting component 932 includes a power source 934 operatively coupled to transmit coil 936 to transmit power to portable electronic device 910 via electromagnetic induction or magnetic resonance. Transmit coil 936 can be an electromagnetic coil that produces a time-varying electromagnetic flux to induce a current within an electromagnetic coil within the portable electronic device (e.g., coil 914). The transmit coil may transmit power at a selected frequency or band of frequencies. In one example the transmit frequency is substantially fixed, although this is not required. For example, the transmit frequency may be adjusted to improve power transfer efficiency for particular operational conditions. More particularly, a high transmit frequency may be selected if more power is required by the accessory and a low transmit frequency may be selected if less power is required by the accessory. In other examples, transmit coil 936 may produce a static electromagnetic field and may physically move, shift, or otherwise change its position to produce a spatially-varying electromagnetic flux to induce a current within the receive coil.

When portable electronic device 910 is operatively attached to wireless charger 930 (e.g., by aligning connection surface 915 of device 910 with charging surface 935 of wireless charger 930 which, for example, can happen in case 200 when wearable device 230 is properly placed within cavity 216), the portable electronic device may use the received current to replenish the charge of its rechargeable battery or to provide power to operating components associated with the electronic device. Thus, when portable electronic device 910 is operatively attached to wireless charger 930, the charger may wirelessly transmit power at a particular frequency via transmit coil 936 to receive coil 914 of the portable electronic device.

Transmit coil 936 can be positioned within the housing of wireless charger such that it aligns with receive coil 914 in the portable electronic device along a mutual axis when the charger is operatively attached to portable electronic device. If misaligned, the power transfer efficiency between the transmit coil and the receive coil may decrease as misalignment increases. The housing of the portable electronic device and the wireless charger can be designed to facilitate proper alignment between connection surface 915 and charging surface 935 to ensure high charging efficiency. In some embodiments of the disclosure, transmit coil 936 is moveable within the housing such that it can be accurately positioned to align with receive coil 914 of different sized portable electronic devices 910.

As also discussed below, in some embodiments, one or more alignment assistance features can be incorporated into the devices to facilitate alignment of the transmit and receive coils along the mutual axis can be employed. As one example, an alignment magnet 938 can be included in wireless charger 930 that magnetically mates with an alignment magnet 918 of portable electronic device 910 to facilitate proper alignment of the portable electronic device and wireless charger. Additionally, the connection and charging surfaces 915, 935 of portable electronic device 910 and wireless charger 930, respectively, may cooperate to further facilitate alignment. For example, in one embodiment connection surface 915 of portable electronic device 910 has a convex shape while charging surface 935 of wireless charger 930 has a concave shape (e.g., as shown in FIG. 8) following the same curvature as connection surface 915 of device 910. In this manner, the complementary geometries may facilitate alignment of the device charger and wearable device in addition to the alignment magnets.

Wireless charger 930 may also include a processor 940 that may execute computer-readable instructions stored in a memory 942 to control the operation of or coordinate one or more functions of the wireless charger and case 200. In some embodiments, wireless charger 930 may also include one or more sensors 944 to determine whether wearable electronic device 910 is received within the case (e.g., placed within cavity 216) and ready to receive transmitted power from the charger. For example, wireless charger 930 may include an optical sensor, such as an infrared proximity sensor. When electronic device 910 is placed within cavity 216, the infrared proximity sensor may produce a signal that processor 940 uses to determine the presence of device 910. Processor 940 may, optionally, use another method or structure to verify the presence of electronic device 910 via sensor 944. Examples of different sensors that may be suitable to detect or verify the presence of device 910 may include a mass sensor, a mechanical interlock, switch, button or the like, a Hall effect sensor, or other electronic sensor. Continuing the example, after sensor 944 reports that the device 910 may be present, the processor 940 may activate a communication channel to attempt to communicate with the device 910, for example, through connector 820.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A case for one or more bands that can be attached to a wrist-worn electronic device, the case comprising:
   first and second housing members foldably coupled together by one or more hinges between a first open position and a second closed position;
   a cavity sized and shaped to hold the one or more bands within the case when the first and second housing members are in the second position;
   an attachment mechanism coupled to the second housing member and positioned within the cavity, the attachment mechanism comprising a piston having a cam profile at a first end and slidably coupled to the second housing member between a first piston position and a second piston position, and a first magnet mechanically coupled to the piston near a second end, opposite the first end; and
   a second magnet positioned within the second housing member and spaced apart from the first magnet, wherein the first and second magnets are aligned to repel each other biasing the piston in the first piston position.

2. The case set forth in claim 1 wherein the cavity includes a lug receiving portion, a band receiving portion and a neck portion between the lug receiving portion and the band receiving portion, wherein the lug receiving portion has a first width and the neck portion has a second width narrower than the first width.

3. The case set forth in claim 2 wherein the first and second magnets bias the piston towards the neck portion.

4. The case set forth in claim 3 wherein the attachment mechanism is configured to secure a lug in the lug receiving portion such that the cam profile of the piston overhangs the lug.

5. The case set forth in claim 4 wherein the attachment mechanism is configured such that, when a lug portion of a band is inserted into the lug receiving portion, the piston slides away from the neck portion enabling the lug to be snapped into a secured position.

6. The case set forth in claim 1 wherein the first housing member has a first inner surface and an opposing first outer surface, the second housing member has a second inner surface and an opposing second outer surface, and the first and second housing members each lay completely flat when the case is open in the first position with the first inner surface facing in the same direction as the second inner surface.

7. The case set forth in claim 6 wherein the one or more hinges further enable the first and second housing members to be rotated to a third folded position in which the first inner surface of the first housing member is facing directly away from the second inner surface of the second housing member.

8. The case set forth in claim 1 wherein the one or more hinges couple a first edge of the first housing member to a second edge of the second housing member, and wherein each of the first and second edges is a fully rounded edge.

9. The case set forth in claim 1 wherein the cavity is sized and shaped to hold two separate bands side-by-side with each other and the attachment mechanism includes a first attachment mechanism to secure a first band within the case and a second attachment mechanism to secure a second band within the case.

10. A case for storing a wrist-worn electronic device and a band that can be attached to the wrist-worn electronic device by a lug coupled to the band, the case comprising:
    first and second housing members foldably coupled together by one or more hinges between a first open position in which the wrist-worn electronic device and band are accessible to a user and a second closed position in which the wrist-worn electronic device and band are enclosed within the case;
    a first recess in one or both of the first and second housing members sized and shaped to hold the wrist-worn electronic device within the case when the first and second housing members are in the second position;
    a second recess in the second housing member;
    an attachment mechanism coupled to the second housing member and positioned within the second recess, the attachment mechanism comprising:
        a piston having a cam profile at a first end and slidably coupled within the second recess between a first piston position and a second piston position, and
        a first magnet mechanically coupled to the piston near a second end, opposite the first end; and
    a second magnet positioned within the second housing member and spaced apart from the first magnet, wherein the first and second magnets are aligned to repel each other biasing the piston in the first piston position.

11. The case set forth in claim 10 wherein the second recess includes a lug receiving portion sized and shaped to receive the lug and wherein the attachment mechanism is slidably coupled to the second housing member within the lug receiving portion.

12. The case set forth in claim 11 wherein the second recess further includes a band receiving portion and a neck portion between band receiving portion and the lug receiving portion, wherein the lug receiving portion has a first width and the neck portion has a second width narrower than the first width.

13. The case set forth in claim 12 wherein the first and second magnets bias the piston towards the neck portion.

14. The case set forth in claim 13 wherein the attachment mechanism is configured to secure a lug in the lug receiving portion such that the cam profile of the piston overhangs the lug.

15. The case set forth in claim 14 wherein the attachment mechanism is configured such that, when a lug portion of a band is inserted into the lug receiving portion, the piston slides away from the neck portion enabling the lug to be snapped into a secured position.

16. A case for storing a wrist-worn electronic device separate from a band that can be attached to the wrist-worn electronic device by a lug coupled to the band, the case comprising:
    a first housing member;
    a second housing member having a first recess sized and shaped to accept the wrist-worn electronic device and a second recess sized and shaped to accept the band;
    one or more hinges that couple the first housing member to the second housing member such that the first and second housing members are foldable between a first open position in which the wrist-worn electronic device and band are accessible and a second closed position in which the wrist-worn electronic device and band are secured within the case;
    an attachment mechanism coupled to the second housing member and positioned within the second recess, the attachment mechanism comprising a piston having a cam profile at a first end and slidably coupled to the second housing member between a first piston position and a second piston position, and a first magnet mechanically coupled to the piston near a second end, opposite the first end; and
    a second magnet positioned within the second housing member and spaced apart from the first magnet, wherein the first and second magnets are aligned to repel each other biasing the piston in the first piston position.

17. The case set forth in claim 16 wherein the second recess includes a lug receiving portion and the attachment mechanism is configured to secure the lug in the lug receiving portion such that the cam profile of the piston overhangs the lug.

18. The case set forth in claim 17 wherein the attachment mechanism is configured such that, when the lug of the band is inserted into the lug receiving portion, the piston slides away towards the second position enabling the lug to be inserted under the cam profile of the piston.

19. The case set forth in claim 16 wherein the first housing member has a first inner surface and an opposing first outer surface, the second housing member has a second inner surface and an opposing second outer surface, and the first and second housing members each lay completely flat when the case is open in the first position with the first inner surface facing in the same direction as the second inner surface.

20. The case set forth in claim 19 wherein the one or more hinges further enable the first and second housing members to be rotated to a third folded position in which the first inner surface of the first housing member is facing directly away from the second inner surface of the second housing member.

* * * * *